United States Patent
Kloster et al.

(10) Patent No.: US 6,734,118 B2
(45) Date of Patent: May 11, 2004

(54) DIELECTRIC MATERIAL TREATMENT (75) Inventors: Grant M. Kloster, Lake Oswego, OR (US); David W. Staines, Portland, OR (US); Jihperng Leu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/252,295

(22) Filed: Sep. 23, 2002

(65) Prior Publication Data
US 2004/0056354 A1 Mar. 25, 2004

(51) Int. Cl.$^7$ ................. H01L 21/31; H01L 21/469
(52) U.S. Cl. ................. 438/795; 438/788; 438/798
(58) Field of Search ................. 438/788, 795, 438/798, 957

(56) References Cited

U.S. PATENT DOCUMENTS

| | | | | |
|---|---|---|---|---|
| 6,124,216 A | * | 9/2000 | Ko et al. | 438/766 |
| 6,528,432 B1 | * | 3/2003 | Ngo et al. | 438/780 |
| 2002/0106500 A1 | * | 8/2002 | Albano et al. | 428/304.4 |

* cited by examiner

Primary Examiner—Alexander Ghyka
(74) Attorney, Agent, or Firm—John F. Travis (57) ABSTRACT

Treatment of dielectric material includes using a directed energy to break bonds in a dielectric material and a reactive gas to repair those bonds with an element of the reactive gas. The treated dielectric material may exhibit greater mechanical strength without a significantly greater dielectric constant. A treatment reactor including a directed energy source apparatus and a delivery mechanism to deliver the reactive gas is also described.

15 Claims, 7 Drawing Sheets

DIELECTRIC MATERIAL TREATMENT

BACKGROUND

Embodiments of the invention relate to semiconductor manufacturing, and in particular relate to treatment of an inter-layer dielectric (ILD) used to hold electrically conductive features.

In the fabrication of semiconductor devices, substrates are provided and processed to form semiconductor devices. For example, in the fabrication of microchips or dice, semiconductor wafers are processed for the subsequent formation of individual dice. The initial wafer serves as a substrate to support features such as transistors and conductive metal lines. Processing generally involves depositing and modifying layers of material on the initial wafer for various purposes. For example, an inter-layer dielectric (ILD) may be deposited and pattered to form and electrically isolate conductive metal lines, or traces. Reducing capacitance between the conductive lines is an important goal in the formation of ILD's.

As semiconductor devices and device features decrease in size, the distance between such conductive lines correspondingly decreases. All other factors remaining constant, this results in a higher capacitance. For example, given parallel conductive lines, capacitance can be determined as $$C = \frac{k \varepsilon A}{d}$$

where (C) is the capacitance. (d) is the distance between the conductive lines, (A) is the area of each conductive line interface, ($\varepsilon$) is the permeability of the ILD material, and (k) is the dielectric constant of the ILD material.

It can be seen from the above equation that, all other factors remaining constant, as the distance between lines decreases, the capacitance increases. Unfortunately, as capacitance increases so does signal transmission time, while high frequency capability may be reduced. Other problems such as increased cross-talk can also occur as the capacitance between lines increases.

The dielectric constant, which has no units of measure, is different for different materials. For example, where the dielectric is of a vacuum or air, the dielectric constant is about equal to 1, having no effect on capacitance. However, most ILD materials have a dielectric constant significantly greater than 1. For example, silicon dioxide, a common ILD material, has a dielectric constant generally exceeding 4. Due to the decreasing size of semiconductor features, which decreases the distance between lines, efforts have recently been made to reduce the dielectric constant of the ILD as a means by which to reduce capacitance.

Low dielectric constant materials (i.e., 'low k' materials), such as SiLK™ (a low-k material manufactured by the Dow Chemical Company at the time of this writing) and carbon doped oxides (CDO's) have been used to form the ILD, thereby reducing capacitance. Unfortunately, such materials are typically weak in mechanical strength when the dielectric constant is below about 2.6. Therefore these materials often deteriorate when exposed to subsequent semiconductor processing. An electron beam may be applied to the ILD in an attempt to rearrange bonds between elements of the ILD, thereby increasing the mechanical strength of the ILD. However, this often leads to the formation of hydroxyl groups within the ILD, which increases the dielectric constant, defeating the purpose of using an otherwise low-k ILD material.

DETAILED DESCRIPTION

In the following description, numerous specific details are set forth. However, it is understood that embodiments of the invention may he practiced without these specific details. In other instances, well-known structures, methods and techniques have not been shown in detail in order not to obscure an understanding of this description.

References to "one embodiment", "an embodiment", "example embodiment", "various embodiments", etc. indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Methods of treating an inter-layer dielectric (ILD) are described. Aspects of various embodiments are described and illustrated by the accompanying drawings. While the following embodiments may be described with reference to a particular semiconductor ILD, the embodiments may be applicable to any dielectric layer that responds to the treatment. This may include dielectric layers that are for integrated circuits, printed circuit boards (PCBs), and package substrates.

Embodiments described below are generally applicable to chemically reacting and/or implanting at least one element of a reactive gas into an ILD. As used herein, the term "chemically react" is defined to mean that one or more elements of the reactive gas become chemically bonded with one or more elements of the ILD. The element may be placed in the ILD by using a directed energy source such as an electron beam to break bonds between some of the initial elements in the ILD, and repairing those broken bonds by substituting elements from the reactive gas. A treatment reactor is also disclosed, in which a semiconductor substrate with an ILD may be exposed to a directed energy source and a reactive gas simultaneously.

Figure 1:
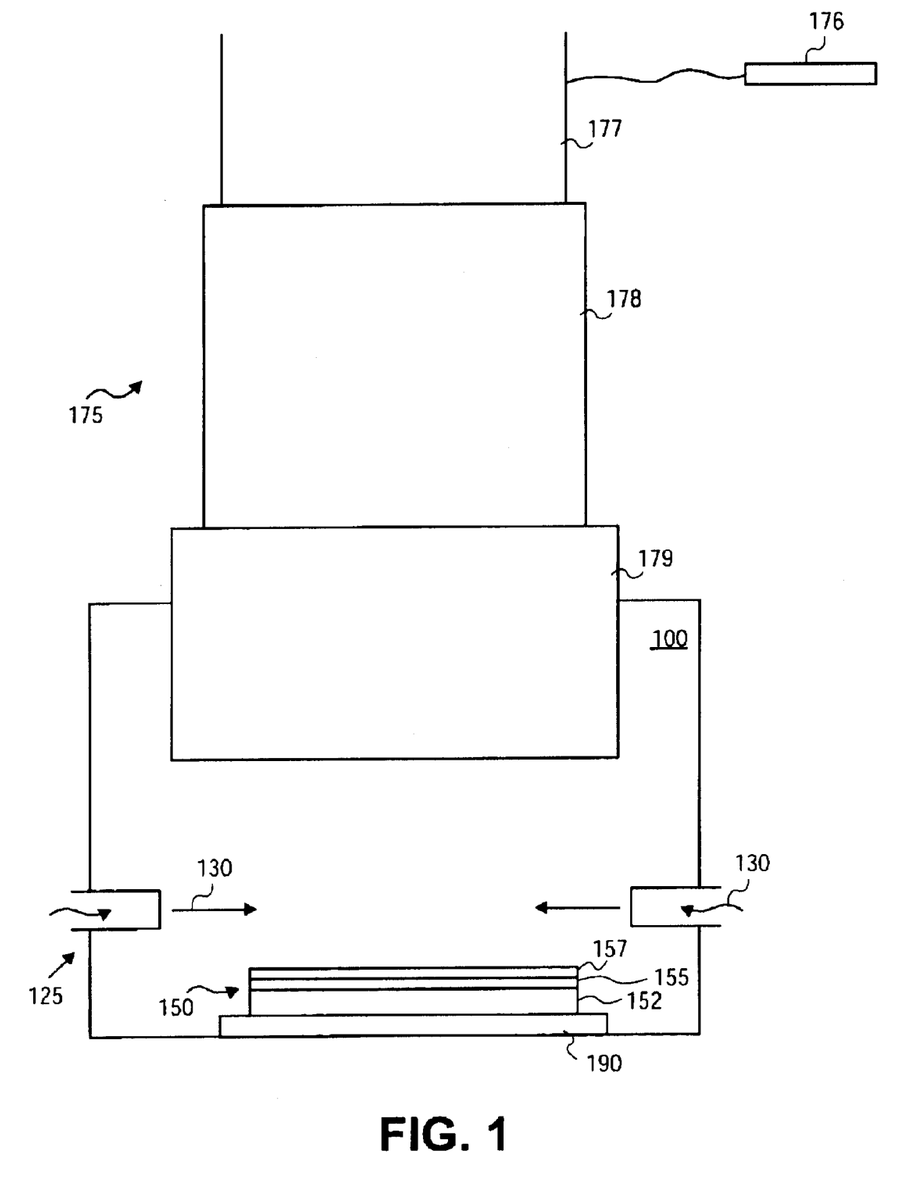
FIG. 1 is a side view of a semiconductor substrate in a treatment reactor containing a reactive gas, according to one embodiment of the invention.
Figure 7:
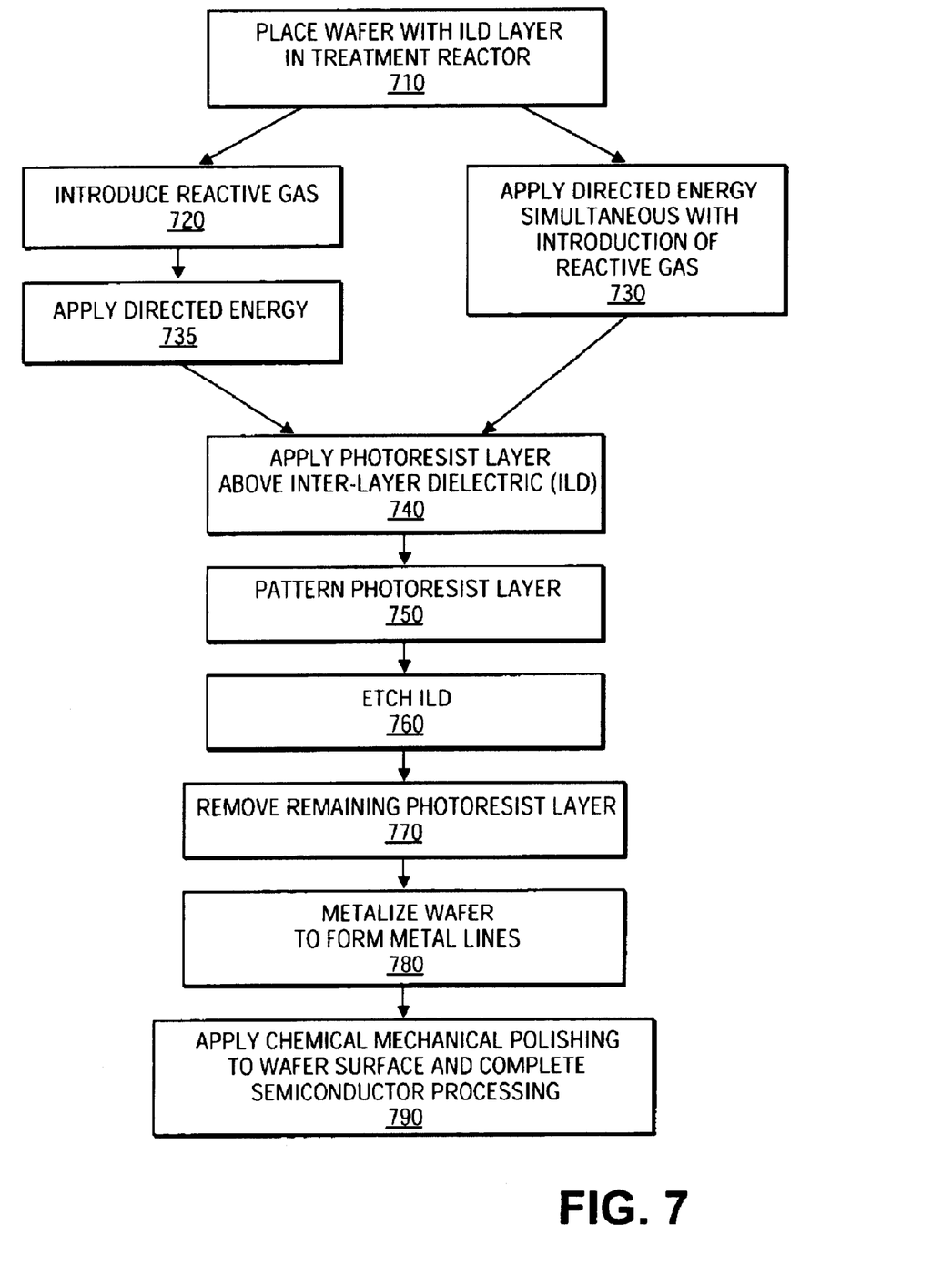
FIG. 7 is a flowchart of a method, according to one embodiment of the invention.

Referring now to FIG. 1, with additional reference to FIG. 7, a wafer 150 is shown sitting on a susceptor 190 in a treatment reactor 100 as indicated at block 710 of FIG. 7. Although the text sometimes makes reference to both FIG. 1 and FIG. 7, embodiments of FIG. 1 and embodiments of FIG. 7 may be practiced independently of each other. In the illustrated embodiment, wafer 150 includes a substrate 152, an etch stop layer 155 above the substrate 152, and an ILD 157 above the etch stop layer 155. (As used herein, relative directional terms such as "above" refer to the orientation shown in the drawings and not necessarily to the physical orientation of an actual device.) The ILD 157 may be deposited by chemical vapor deposition or other means that are currently known or yet to be developed. As described below, the ILD 157 is for electrical isolation of conductive lines or other semiconductor circuitry that is to be fabricated into the ILD layer. The ILD 157 may be treated as described below to be able to have a low dielectric constant while having enough mechanical strength to withstand the rigors of semiconductor processing.

In one embodiment, an ILD that initially has a relatively low mechanical strength is treated in the manner described to increase that mechanical strength without significantly increasing the dielectric constant of the ILD. FIG. 7 is referenced in the following description as an aid in describing features and methods of treating the ILD.

In one embodiment the material of ILD 157 has a dielectric constant that is less than about 4, but other embodiments may have a dielectric constant above this range. Embodiments of the ILD may include various materials, such as SiLK™, fluorinated silica glass, and carbon doped oxides (CDOs). The CDOs may include one or more of carbon, oxygen, and silicon, and may have various formulas. Particular embodiments of CDOs may include one or more of $H_xSi(O)_{4-x}$, $(CH_3)_xSi(OCH_3)_{4-x}$, and $(CH_3)_xSi(O)_{4-x}$, but other embodiments may use other components.

In the embodiment shown, the wafer 150 is placed within a treatment reactor 100 for treatment of the ILD 157. A delivery mechanism 125, such as a tube, valve, nozzle, or other suitable device, may introduce a reactive gas 130, as shown at block 720 of FIG. 7, into the treatment reactor 100. In one embodiment, the reactive gas 130 is introduced into treatment reactor 100 without any preprocessing, but other embodiments may process the reactive gas before introduction into the treatment reactor. For example, the reactive gas may be heated to a specified temperature, ionized, mixed with another gas, etc.

The treatment reactor 100 may use various pressures and temperatures. For example, in one embodiment pressure is maintained below about 10.0 Torr, and a temperature of the susceptor 190 is maintained between about 25° C. and about 400° C., but other pressures and temperatures may be used.

The reactive gas 130 may include one or more compounds having an element that will chemically react with broken bonds in the ILD 157. For example, in an embodiment in which fluorine is the reactive element, the reactive gas may include one or more fluorine compounds (e.g., carbon tetrafluoride ($CF_4$), octafluorocyclobutane ($C_4F_8$), methyl fluoride ($CH_3F$), sulfur hexafluoride ($SF_6$), etc.) Other reactive elements and other reactive gases may also be used.

Figure 2:
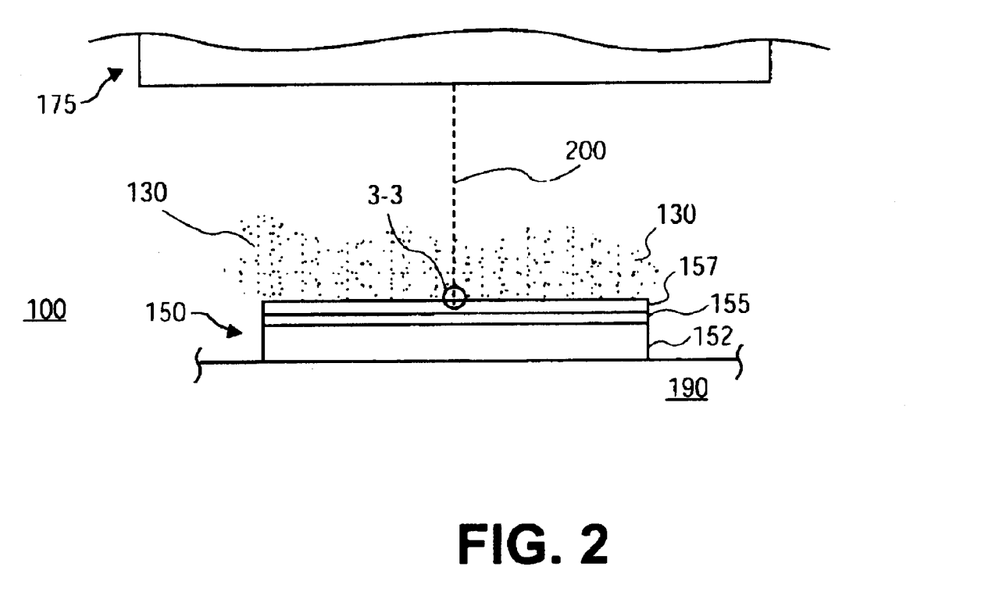
FIG. 2 is a side view of the semiconductor substrate of FIG. 1, exposed to a directed energy source in the treatment reactor, according to one embodiment of the invention.

With reference to FIGS. 1 and 2, the treatment reactor 100 may include a directed energy source apparatus 175 for directing energy into ILD 157. The directed energy may disrupt the bonds within the molecules of the ILD 157, causing portions of the molecules to break free. Portions of the reactive gas may then become attached to the broken connections, forming a molecule with a different structure.

Depending on the type of energy source used, the energy may be directed into specified areas of the ILD 157 in a controlled manner. This differs markedly from a conventional plasma treatment, in which the energy of the plasma is substantially constant throughout the chamber or varies with location in the chamber in a substantially uncontrollable way.

In one embodiment the directed energy 200 is applied at substantially the same time that the reactive gas 130 is introduced, as indicated at block 730 of FIG. 7. Alternatively, the directed energy 200 may be applied after introduction of the reactive gas 130 as indicated at blocks 720 and 735 of FIG. 7.

In one embodiment, the directed energy source apparatus 175 is an electron beam gun. The gun may include a filament housing 177 coupled to a power source 176. In the illustrated embodiment, the power source activates a filament in the filament housing to generate an electron beam in the form of directed energy 200. The electron beam travels through a column 178 and a lens 179 where it is controlled and directed toward the ILD 157.

FIG. 2 shows a close-up view of portions of FIG. 1. In one embodiment in which the directed energy 200 is an electron beam, the electron beam may have an acceleration voltage of between about 2 kilo-electron volts (kev) and about 20 kev, such as about 10 kev. The acceleration voltage may be used to control the depth of penetration of the electrons into the material of the ILD 157. In one embodiment the electron beam is applied for a time sufficient to deliver between about 20 micro-coulombs and about 3,000 micro-coulombs to the ILD 157, but other times and/or dosages may be used. The amount of time required to deliver the required dose is dependent upon various factors, such as the operating temperature of the treatment reactor 100, the particular composition of the ILD 157, the particular amount of the ILD 157 to be treated, etc.

Although directed energy has been described in the form of an electron beam, other energy forms may be utilized which are directed specifically at the target ILD 157. For example, other forms of directed energy may include one or more of an ion beam, microwave, ultraviolet light, etc.

In one embodiment the ILD 157 is between about 0.5 and about 1.0 microns in thickness, but other thicknesses may be used. In a particular embodiment, the directed energy 157 is sufficient to penetrate to an average depth of between about 0.25 microns and 0.50 microns, with penetration distribution above and below the average depth. In this manner, some electrons may penetrate to most or all depths of the ILD 157.

Figure 3:
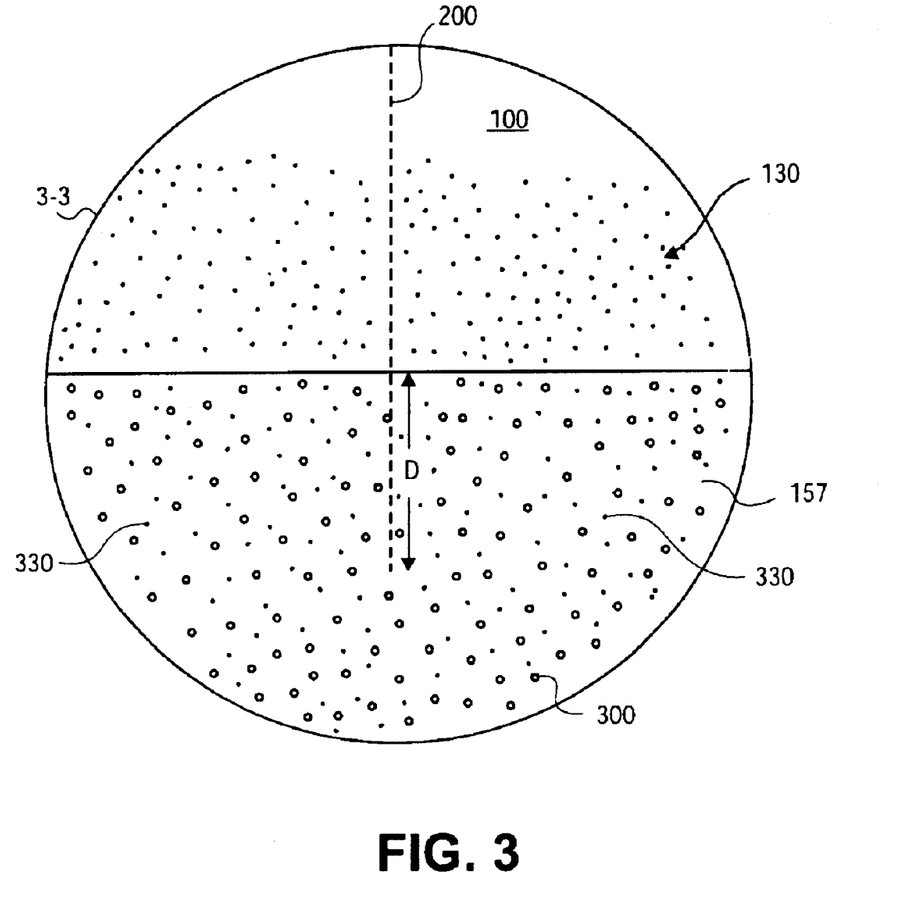
FIG. 3 is an enlargement of a portion of FIG. 2, according to one embodiment of the invention.

Referring to FIG. 3, an enlarged view of section 3—3 of FIG. 2 is shown. The directed energy 200 is shown traveling through the reactive gas 130 and penetrating the ILD 157. As the directed energy 200 travels into ILD 157, it may break various atomic bonds within the material of ILD 157, causing portions of the molecular structure to break free. Ions of the reactive gas 130 may then react with the broken bond and bond themselves into the ILD 157, thereby healing the broken bond by substituting a different element or compound than the one that was broken loose. This replacement may make the ILD material mechanically stronger, without significantly increasing the dielectric constant of the ILD material, and may even decrease the dielectric constant. For example, in an embodiment in which the directed energy 200 is an electron beam and the reactive gas 130 includes a compound having fluorine, elements of fluorine may be chemically reacted into the ILD 157. This may be seen in the following equation where the ILD 157 is a CDO with the formula $(CH_3)_xSi(O^-)_{4-x}$, and the reactive gas 130 is $SF_6$:

As shown in the above diagram, the application of the electron beam to the CDO dislodges some of the methyl groups (CH₃), and fluorine (F) from the reactive gas 130 replaces some of those methyl groups in the CDO structure. This creates a different structure in the ILD that has a lower dielectric constant. The treatment described also reduces the chance of forming hydroxyl (OH) groups in place of the methyl groups, which would otherwise tend to increase the dielectric constant. Additionally, this process may have the effect of adding additional silicon cross-linking to the structure of the ILD 157 as shown above, where the silicon joins with two oxygens in a common bond. The added cross-linking may increase the mechanical strength of the ILD 157.

The ILD 157 may be made of a porous material (e.g. note pores 300 in FIG. 3). The pores may permit the reactive gas 130 to penetrate into ILD 157, where the reactive gas will be available for the previously-described chemical reaction deep within ILD 157. Thus the porosity of ILD 157, combined with the penetrating ability of the directed energy 200, may permit the improvements in dielectric constant and/or strength to be distributed well below the surface of ILD 157, and in some embodiments throughout much or all of the thickness of ILD 157.

Figure 4:
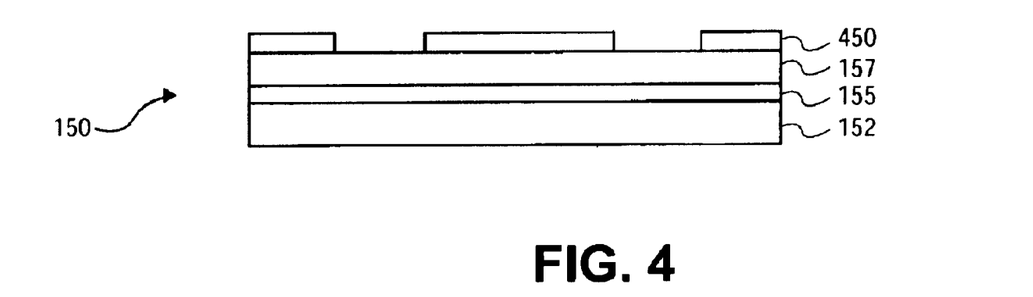
FIG. 4 is a side view of the semiconductor substrate of FIG. 3 following exposure to a photomasking process, according to one embodiment of the invention.

Referring to FIG. 4, with additional reference to FIG. 7, once the ILD 157 is treated, it may be subjected to additional processing operations. Blocks 740–790 Of FIG. 7 describe one embodiment in which conductive lines are formed within the ILD 157. The wafer 150 is shown in FIG. 4 with a patterned photoresist 450 above the ILD 157. The photoresist material may be a material that is resistant to a subsequently used etchant, but susceptible to deterioration upon exposure to an energy source such as light. In one embodiment the photoresist material is applied to the surface at block 740, patterned at block 750 by exposing it to a pattern of light that changes the nature of the photoresist material in the exposed areas, and developed to remove the exposed areas of photoresist. This process may result in the photoresist layer 450 of FIG. 4 that covers some areas of ILD 157 but leaves other areas of ILD 157 exposed. The photoresist material may use materials and techniques that are currently known or yet to be developed.

At block 760 of FIG. 7, the ILD may be etched in the pattern that was developed in the photoresist layer. In one embodiment an etchant is introduced that etches the exposed areas of ILD, while the areas of the ILD that are under the photoresist material remain relatively intact. While in a particular embodiment the exposed areas of the ILD layer are etched away all the way through the ILD material, and etching stops only when the etch-stop layer beneath the ILD layer is reached, in other embodiments the depth of etching may penetrate only partially into the ILD layer by controlled such etch parameters as the time, temperature, chemical strength of the etchant, etc.

The remaining photoresist material may then be removed as shown at block 770. In one embodiment the process of blocks 760–770 results in the structure shown in FIG. 5, in which the pattern that was originally developed in the photoresist material is now in the ILD, providing trenches 500 which may be used to create metal lines. (The trenches are shown in edge view in FIG. 5.)

Returning to FIG. 7, at block 780 a metalization process may be used to deposit conductive metal into the trenches 500. In one embodiment the wafer 150 is placed in a metalization reactor that deposits metal onto the exposed surface areas of the wafer, thus filling up the trenches with metal. In some embodiments the metalization process may be a conventional electroplating process, but other processes may also he used. In one embodiment the metal material may be introduced into the reactor in vapor form, and radio frequency (RF) energy may be applied to excite the metal material to a plasma state.

The metalization described may proceed at various pressures, temperatures, and power. For example, in one embodiment, pressure is maintained between about 2.0 Torr and about 10.00 Torr, a susceptor supporting the semiconductor substrate 150 heated to between about 250° C. and about 450° C., and between about 1,600 watts and about 1,800 watts of RF energy are supplied.

Since the deposited metal may also cover areas outside the trenches where the metal is not wanted, at block 790 a chemical-mechanical polishing (CMP) process may be used to remove the unwanted metal. CMP involves subjecting the surface of the wafer to a chemical slurry and the force of a rotating polishing pad, which removes all material down to a predetermined level. By polishing away all material down to the top surface of the ILD, the only remaining metal from the metalization process will be that metal in the trenches, which now form conductive lines.

Figure 5:
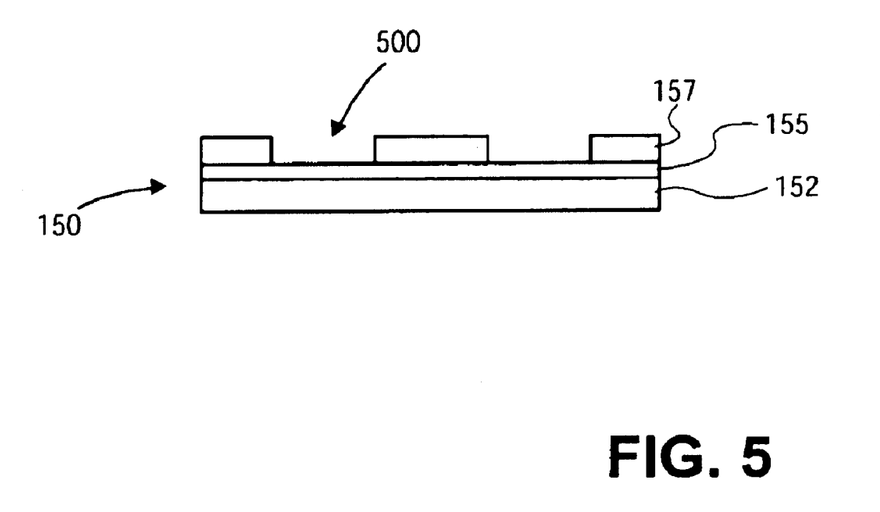
FIG. 5 is a side view of the semiconductor substrate of FIG. 4 followings etching, according to one embodiment of the invention.
Figure 6:
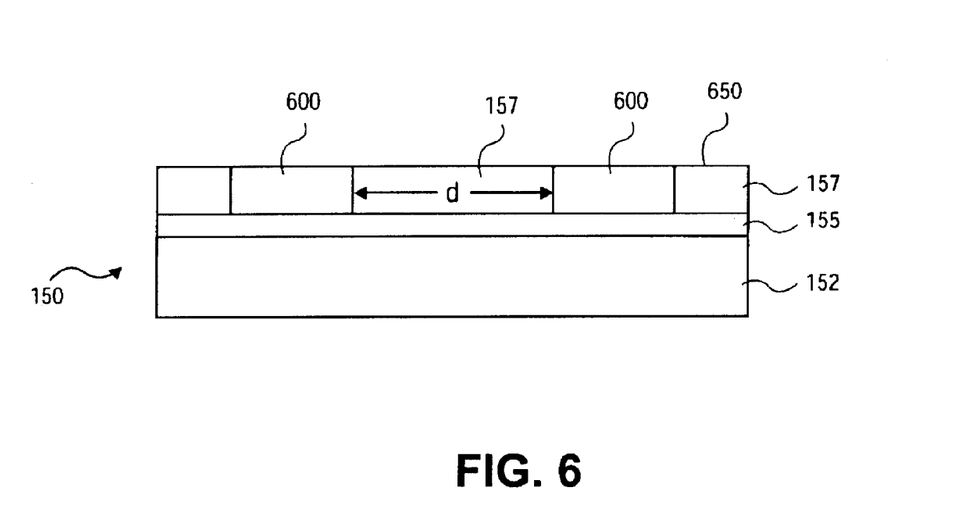
FIG. 6 is a side view of the semiconductor substrate of FIG. 5 following metalization and other semiconductor processing, according to one embodiment of the invention.

FIG. 6 shows one embodiment after the metalization and CMP operations have been performed. As shown, conductive metal lines 600 (shown on edge) now occupy the previously open trenches 500 of FIG. 5, with no material above top surface 650 of the ILD 157. The metal lines 600 are insulated by the material of the ILD 157 and separated by a distance (d). As seen from the previously-described relationship $$C = \frac{k\varepsilon A}{d}$$

reduction of the dielectric constant k of the ILD material through the aforementioned techniques reduces capacitance C, and/or increases mechanical strength of the ILD so that it can withstand the rigors of CMP and other post-treatment processing.

While the embodiments described above make particular reference to the use of an element of a reactive gas for the purpose of lowering or maintaining a low dielectric constant, other element types may be chemically reacted in an ILD for other purposes. For example, in one embodiment the reactive gas may be a hydrogen ($H_2$) gas, wherein elements of hydrogen are placed into an ILD according to methods described above, in order to provide a more hydrophobic character to the ILD. Similarly, in another embodiment, the reactive gas may be an oxygen gas (e.g. $O_2$), wherein elements of oxygen are placed into an ILD according to methods described above to provide a hydrophilic character to at least the surface of the ILD. A hydrophilic or hydrophobic ILD character may aid in subsequent semiconductor processing such as material deposition, with the particular character of benefit depending upon the particular material to be deposited on the ILD. In addition to these examples, many other changes, modifications, and substitutions may be made without departing from the spirit and scope of these embodiments.

We claim:

1. A method comprising:
   directing a controllable energy into a dielectric material, the controllable energy selected from a group consisting of an electron beam, an ion beam, and an ultraviolet light; and
   exposing the dielectric material to a reactive gas to chemically react an element of the reactive gas into the dielectric material.

2. The method or claim 1 wherein:
   said exposing reduces a dielectric constant value for the dielectric material.

3. The method of claim 1 wherein:
   the dielectric material includes silicon; and
   said exposing adds silicon cross-linking to the dielectric material.

4. The method of claim 1 wherein:
   the reactive gas is selected from a group consisting of carbon tetrafluoride, octafluorocyclobutane, methyl fluoride, sulfur hexafluoride, hydrogen, and oxygen.

5. The method of claim 1 wherein:
   the element is one of fluorine, hydrogen, and oxygen.

6. The method of claim 1 wherein:
   the dielectric material is an inter-layer dielectric material on u semiconductor substrate.

7. The method of claim 6, wherein:
   said exposing further includes
      placing the semiconductor substrate in a treatment reactor;
      activating a delivery mechanism of the treatment reactor to provide the reactive gas; and
      activating a directed energy source apparatus of the treatment reactor to provide the directed energy.

8. The method of claim 7 wherein:
   said activating the delivery mechanism includes generating a plasma with the reactive gas.

9. The method of claim 7 wherein:
   said activating the delivery mechanism and said activating the directed energy source apparatus occur simultaneously.

10. The method of claim 7 wherein:
    the directed energy comprises an electron beam.

11. The method of claim 10 wherein:
    said activating the directed energy source apparatus further includes delivering between about 20 micro-coulombs and about 3,000 micro-coulombs to the inter-layer dielectric material with an electron beam.

12. The method of claim 10 wherein:
    said activating the directed energy source apparatus further includes using an acceleration voltage for the electron beam of between about 2 kilo-electron volts and about 20 kilo-electron volts.

13. A method comprising:
    forming parallel conductive lines insulated by an inter-layer dielectric of a semiconductor substrate, the inter-layer dielectric having an element of a reactive gas chemically reacted therein by exposure to the reactive gas and an electron beam.

14. The method of claim 13 wherein:
    said forming further includes
      applying a photoresist layer above the inter-layer dielectric;
      forming a pattern in the photoresist layer;
      etching the inter-layer dielectric based upon the pattern; and
      metalizing the semiconductor substrate.

15. The method of claim 15, further comprising:
    applying chemical mechanical polishing to a surface of the semiconductor substrate.

* * * * *

UNITED STATES PATENT AND TRADEMARK OFFICE
CERTIFICATE OF CORRECTION

PATENT NO. : 6,734,118 B2
DATED : May 11, 2004
INVENTOR(S) : Kloster et al.

It is certified that error appears in the above-identified patent and that said Letters Patent is hereby corrected as shown below:

Column 1,
Line 11, delete "arc" and insert -- are --.
Line 17, delete "pattered" and insert -- patterned --.

Column 2,
Line 15, delete "followings" and insert -- following --.
Line 25, delete "arc" and insert -- are --.
Line 27, delete "he" and insert -- be --.

Column 5,
Line 38, delete "photorcsist" and insert -- photoresist --.
Line 50, delete "he" and insert -- be --.

Column 6,
Line 10, delete "he" and insert -- be --.

Column 7,
Line 10, delete "or" and insert -- of --.
Line 26, delete "u" and insert -- a --.

Column 8,
Line 34, delete "15" and insert -- 14 --.

Signed and Sealed this

Thirtieth Day of November, 2004

JON W. DUDAS
*Director of the United States Patent and Trademark Office*